US008568571B2

(12) United States Patent
Kwak et al.

(10) Patent No.: US 8,568,571 B2
(45) Date of Patent: Oct. 29, 2013

(54) THIN FILM BATTERIES AND METHODS FOR MANUFACTURING SAME

(75) Inventors: Byung Sung Kwak, Portland, OR (US);
Michael Stowell, Loveland, CO (US);
Nety Krishna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 975 days.

(21) Appl. No.: 12/124,918

(22) Filed: May 21, 2008

(65) Prior Publication Data

US 2009/0288943 A1    Nov. 26, 2009

(51) Int. Cl.
*C23C 14/00*    (2006.01)

(52) U.S. Cl.
USPC ............. 204/192.12; 204/192.17; 204/192.15

(58) Field of Classification Search
USPC ................ 409/209–246; 204/192.12, 192.15; 429/209–246
See application file for complete search history.

(56) References Cited

U.S. PATENT DOCUMENTS

| | | | | |
|---|---|---|---|---|
| 4,824,546 | A * | 4/1989 | Ohmi | 204/298.08 |
| 5,116,482 | A * | 5/1992 | Setoyama et al. | 204/298.08 |
| 5,178,739 | A * | 1/1993 | Barnes et al. | 204/192.12 |
| 5,563,734 | A * | 10/1996 | Wolfe et al. | 359/360 |
| 5,591,543 | A * | 1/1997 | Peled et al. | 429/312 |
| 5,886,866 | A | 3/1999 | Hausmann | |
| 6,235,169 | B1 | 5/2001 | Gopalraja et al. | |
| 6,267,943 | B1 * | 7/2001 | Manev et al. | 423/599 |
| 6,320,311 | B2 * | 11/2001 | Nakaya et al. | 313/506 |
| 6,376,027 | B1 | 4/2002 | Lee et al. | 425/535 |
| 6,506,289 | B2 * | 1/2003 | Demaray et al. | 204/192.26 |
| 6,827,826 | B2 | 12/2004 | Demaray et al. | |
| 6,886,240 | B2 | 5/2005 | Zhang et al. | |
| 6,921,464 | B2 | 7/2005 | Krasnov et al. | |
| 6,994,933 | B1 | 2/2006 | Bates | |
| 7,186,479 | B2 | 3/2007 | Krasnov et al. | |
| 7,247,221 | B2 | 7/2007 | Stowell, Jr. | |
| 7,469,558 | B2 | 12/2008 | Demaray et al. | |

(Continued)

FOREIGN PATENT DOCUMENTS

KR    10-0273326 B1    12/2000

OTHER PUBLICATIONS

Yamamura, Satoru et al., In situ conductivity measurements of LiMn2O4 thin films during lithium insertion/extraction by using interdigitated microarray electrodes, Journal of Solid State Electrochem (1998) 2: p. 211-215.*
Dudney, Materials Science and Engineering B 116:245-249 (2005).

(Continued)

*Primary Examiner* — John Brayton
(74) *Attorney, Agent, or Firm* — Mark J. Danielson; Pillsbury Winthrop Shaw Pittman LLP

(57) ABSTRACT

A method of fabricating a layer of a thin film battery comprises providing a sputtering target and depositing the layer on a substrate using a physical vapor deposition process enhanced by a combination of plasma processes. The deposition process may include: (1) generation of a plasma between the target and the substrate; (2) sputtering the target; (3) supplying microwave energy to the plasma; and (4) applying radio frequency power to the substrate. A sputtering target for a thin film battery cathode layer has an average composition of $LiM_aN_bZ_c$, wherein $0.20 > \{b/(a+b)\} > 0$ and the ratio of a to c is approximately equal to the stoichiometric ratio of a desired crystalline structure of the cathode layer, N is an alkaline earth element, M is selected from the group consisting of Co, Mn, Al, Ni and V, and Z is selected from the group consisting of $(PO_4)$, O, F and N.

19 Claims, 4 Drawing Sheets

(56) References Cited

U.S. PATENT DOCUMENTS

| | | |
|---|---|---|
| 7,837,838 B2 | 11/2010 | Chua et al. |
| 2004/0048157 A1 | 3/2004 | Neudecker et al. |
| 2004/0064937 A1 | 4/2004 | Krasnov et al. |
| 2006/0062904 A1* | 3/2006 | West et al. ............ 427/126.3 |
| 2006/0134522 A1 | 6/2006 | Zhang et al. |
| 2007/0131651 A1 | 6/2007 | Goto et al. |
| 2008/0173542 A1 | 7/2008 | Neudecker et al. |

OTHER PUBLICATIONS

Kim et al., Crystal Structures, Electrical Conductivities and Electrochemical Properties of $LiCo1-xMgxO2(0 \leq x \leq 0.11)$, Journal of Power Sources 159:233-236 (2006).

Zhang et al., Electrochemical and Solid-State Letters, 3:309-311 (2000).

International Search Report and Written Opinion issued Jan. 12, 2010 for PCT Application No. PCT/US2009/044691.

Werbaneth, P. et al.; "The Reactive Ion Etching of Au on GaAs Substrates in a High Density Plasma Etch Reactor," The International Conference on Compound Semiconductor Manufacturing Technology, St Louis, 1999, 4 pages. Available at: http://gaasmantech.com/Digests/1999/Pdf/12.pdf.

Hayashi M., et al, "Preparation of positive $LiC02$ films by electron cyclotron resonance (ECR) plasma sputtering method and its application to all-solid-state thin-film lithium batters," Journal of Power Sources, vol. 174, No. 2, Dec. 6, 2007, pp. 990-995.

* cited by examiner

THIN FILM BATTERIES AND METHODS FOR MANUFACTURING SAME

FIELD OF THE INVENTION

The present invention relates to thin film batteries, and in particular, improved cathode materials and deposition techniques for certain layers of a thin film battery structure.

BACKGROUND OF THE INVENTION

All solid state Thin Film Batteries (TFB) are known to exhibit several advantages over conventional battery technology such as superior form factors, cycle life, power capability and safety. However, there is a need for cost effective and high-volume manufacturing (HVM) compatible fabrication technologies to enable broad market applicability of TFBs.

Most of the past and current state-of-the-art approaches, as they pertain to TFB and TFB fabrication technologies, have been conservative, wherein the efforts have been limited to scaling the basic technologies of the original Oak Ridge National Laboratory inventions that started in the early 1990s. More recently, some efforts to improve the properties and deposition rates for the cathode and electrolyte material layers have been seen. First is the application of a pulsed DC sputtering (i.e. pDC) technique to the cathode (LiCoO$_2$ specifically; e.g. U.S. Patent Pub. 2006/0134522), with some improvement in deposition rate. In addition, substrate biasing has been applied to both cathode (U.S. Patent Pub. 2006/0134522 and U.S. Pat. No. 6,921,464, the second one with RF on the target) and electrolyte (U.S. Pat. No. 6,506,289) deposition steps, leading to some improved properties. However, much improvement is still needed.

FIGS. 1A to 1F illustrate a traditional process flow for fabricating a TFB on a substrate. In the figures, a top view is shown on the left, and a corresponding cross-section A-A is shown on the right. There are also other variations, e.g., an "inverted" structure, wherein the anode side is grown first, which are not illustrated here.

As shown in FIGS. 1A and 1B, processing begins by forming the cathode current collector (CCC) 102 and anode current collector (ACC) 104 on a substrate 100. This can be done by (pulsed) DC sputtering of metal targets (~300 nm) to form the layers (e.g. main group metals such as Cu, Ag, Pd, Pt and Au, metal alloys, metalloids or carbon black), followed by masking and patterning for each of the CCC and ACC structures. It should be noted that if a metallic substrate is used, then the first layer may be a "patterned dielectric" deposited after a blanket CCC 102 (the CCC may be needed to block Li in the cathode from reacting with the substrate).

Next, in FIGS. 1C and 1D, the cathode 106 and electrolyte layers 108 are formed, respectively. RF sputtering has been the traditional method for depositing the cathode layer 106 (e.g. LiCoO$_2$) and electrolyte layer 108 (e.g. Li$_3$PO$_4$ in N$_2$). However, pulsed DC has been used for LiCoO$_2$ deposition. The cathode 106 layer can be about 3 µm thick, and the electrolyte 108 layer can be about 1-2 µm thick.

Finally, in FIGS. 1E and 1F, the Li layer 110 and protective coating (PC) layer 112 are formed, respectively. The Li layer 110 can be formed using an evaporation process. The Li layer 110 can be about 3 µm thick (or other thickness depending on the thickness of the cathode layer) and the PC layer 112 can be in the range of 3 to 5 µm. The PC layer 112 can be a multilayer of parylene, metal or dielectric as disclosed by Oak Ridge National Laboratory. Note that, between formation of the Li layer and the PC layer, the part must be kept in an inert environment, such as argon gas.

There may be an additional "barrier" layer deposition step, prior to the CCC 102, if the CCC does not function as the barrier and if the substrate and patterning/architecture call for such a barrier layer. Also, the protective coating need not be a vacuum deposition step.

In typical processes, annealing of the cathode layer 106 will be required if the TFB performance specification calls for "plateau of operating voltage" and high power capability. A summary of the TFB properties can be found in N. J. Dudney, Materials Science and Engineering B 116, (2005)245-249.

While some improvements have been made to the original ORNL approaches, there are many problems with the prior art fabrication processes for TFBs that prevent them from being compatible with cost effective and high-volume manufacturing (HVM), and thereby preclude broad market applicability of TFBs. For example, issues with the state-of-the-art thin film cathode and cathode deposition processes include: (1) a low deposition rate leading to low throughput and inefficient scaling (of economy) for cost reduction, (2) a need for a high temperature anneal for the crystalline phase, which adds to process complexity, low throughput and limitations on the choice of substrate materials, and (3) a higher electrical and ionic resistivity, which limits the thickness of the cathode and high power (in battery operation) application, as well as the applicable sputtering methodology and sputtering power (which determines deposition rate).

With respect to the electrolyte, RF sputtering does not provide a high deposition rate with good conformality for pinhole free deposition. The low deposition rate RF sputtering process affects the throughput while the low conformality affects yield. The electrolyte is the key layer that allows the TFB to function as an energy storage device. More particularly, electrolyte layers with very high electrical resistivity ($>1\times10^{14}$ ohm-cm), have been deposited using RF sputtering with rates up to ~2 Å/sec. Recently, when electrolyte layers were deposited using a PECVD process, the deposition rates appear to be higher, and provide reasonable properties in the resulting films. However, the long term reliability (cycle life) appears less than that observed in TFBs produced with RF sputtered layers. This discrepancy can be attributed to reactions between the charge carriers (lithium) and the impurity inclusions that likely result, during the PECVD processing, from incomplete oxidation of the organic ligands of the volatile precursors. As such, improvement in this layer will lead to significant outcomes for the overall technology.

Accordingly, a need remains in the art for fabrication processes and technologies for TFBs that are compatible with cost effective and high-volume manufacturing (HVM), and thereby enable broad market applicability of TFBs.

SUMMARY OF THE INVENTION

The present invention relates to methods and apparatuses that overcome key problems of current state-of-the-art thin film battery (TFB) technologies that preclude broad market applications. According to aspects of the invention, a key detriment addressed is the high cost of manufacturing, which can be attributed to both TFB technology and TFB manufacturing technologies. According to aspects of the invention, application of such techniques, methods and materials leads to much improved physical properties of TFBs (e.g. for improved performance with higher ionic and electronic conductivity), simplification of the TFB fabrication process (e.g. elimination or reduction of anneal step), and increase in throughput for HVM compatibility. All of these benefits will lead to reduced cost per function (or energy density) for truly broad application.

In one embodiment, the invention provides techniques and methods for new cathode materials and deposition methods for improved battery performance. A method of fabricating a layer of a thin film battery comprises providing a sputtering target and depositing the layer on a substrate using a physical vapor deposition process enhanced by a combination of plasma processes. The plasma processes are designed to transfer energy to a combination of: (a) the ions which bombard the target, (b) the ions in the bulk plasma between the target and the substrate, and (c) the ions hitting the deposition surface. Control of these ion energies and densities affects the deposition rate and morphology of deposited layers. The deposition process may include: (1) generation of a plasma between the target and the substrate; (2) sputtering the target; (3) supplying microwave energy to the plasma, including electron cyclotron resonance (ECR); and (4) applying radio frequency power, in continuous wave (CW) or burst mode, at a first frequency to the substrate. The sputtering step may include applying radio frequency power, of a second frequency, to the target. The first and second frequencies may either be sufficiently different to avoid interference effects or may be the same and locked in phase. Furthermore, when the target is sufficiently conductive, the sputtering step may include applying (pulsed) direct current to the target. High power pulsed magnetron (HPPM) may also be utilized as a sputtering power supply.

In another embodiment, the invention provides new deposition sources to facilitate the TFB fabrication process—increasing the throughput and yield. A sputtering target for a thin film battery cathode layer is manufactured to have an average composition of $LiM_aN_bZ_c$, wherein $0.20>\{b/(a+b)\}>0$ and the ratio of a to c is approximately equal to the stoichiometric ratio of a desired crystalline structure of the cathode layer, N is an alkaline earth element, M is selected from the group consisting of Co, Mn, Al, Ni and V, and Z is selected from the group consisting of $(PO_4)$, O, F and N. The metals represented by M and the substitutional elements represented by N are not restricted to single species. For example, M may include both Co and Mn. In preferred embodiments, $0.12>\{b/(a+b)\}>0.05$. Furthermore, the target may also comprise other substitutional elements taken from the transition metals in the periodic table. A desirable property of a deposited TFB cathode layer is good crystallinity and relatively high conductivity, whereby post deposition annealing is not required and the layer may be made relatively thick for increased capacity, but without compromising the power (current) density.

For electrolytes, the addition of energy to the growing film will allow enhanced conformality by allowing additional energy to promote surface diffusion of deposited species. Thus, pinhole free layers can be achieved with lesser thickness. This will help with throughput and battery properties, for example power density or capacity, by reducing the internal impedance.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1A:
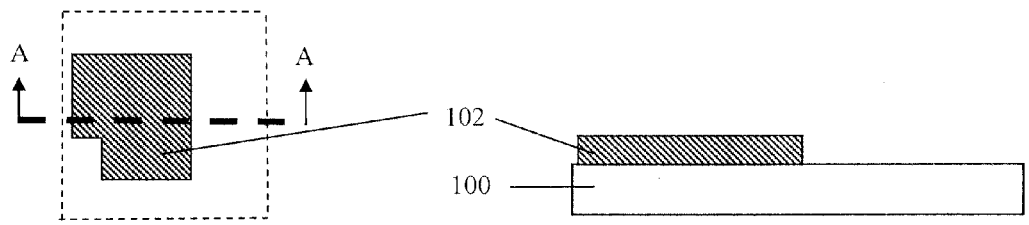
FIGS. 1A to 1F illustrate steps of a conventional process for forming TFBs.
Figure 1B:
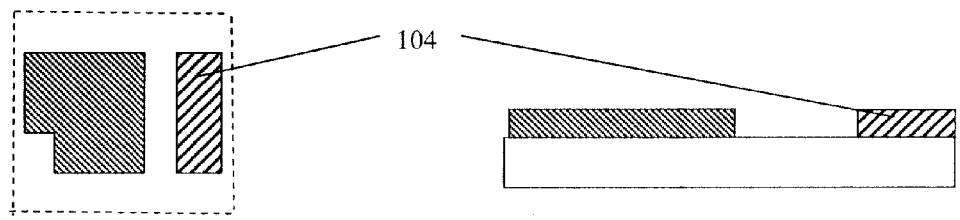

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the present invention overcomes several of the key problems of current state-of-the-art thin film battery (TFB) technologies that preclude them from being compatible with cost-effective and high-volume manufacturing. In one embodiment, the invention provides concepts for new cathode materials and new deposition methods for improved battery performance. In another embodiment, the invention provides new deposition sources to reduce various requirements of the TFB fabrication process, and thereby increase the throughput and yield.

According to a first embodiment described herein, the present inventors leverage past studies in bulk (not thin film form) cathode materials with $LiMn_2O_4$ and $LiCoO_2$, wherein the Mn and Co were fractionally substituted for improved electrical and electrochemical material properties. See, for example for $LiMn_2O_4$, F. Zhang and S. Whittingham, Electrochemical and Solid-State Letters, 3 (2000) 309-311, and for $LiCoO_2$, H. J. Kim et al., J. Power Sources, 159 (2006) 233-236.

More particularly, in a first embodiment, the present inventors' concept for the new cathode materials includes modifying the original material so that both the electrical and ionic conductivities are increased. This is achieved by adjusting the composition of the sputter target materials. For example, in the cathode material $LiCoO_2$, the present inventors recognize that replacing some of the Co with Mg can lead to a significant increase in electrical conductivity. In addition, the lattice parameters, as well as the interstitial channels, can be expected to increase in size. The present inventors further recognize that this increase in lattice constant and channels can lead to an increase in ionic conductivity as well.

Figure 1C:
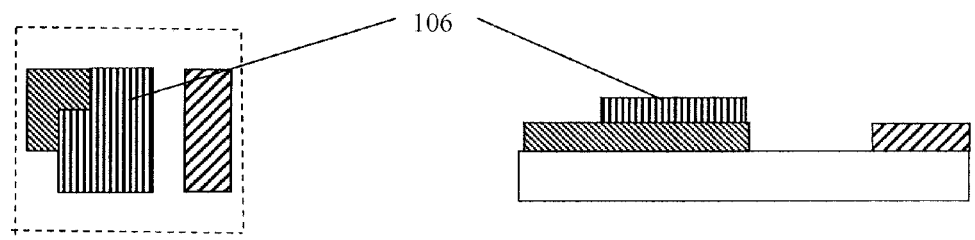
Figure 1D:
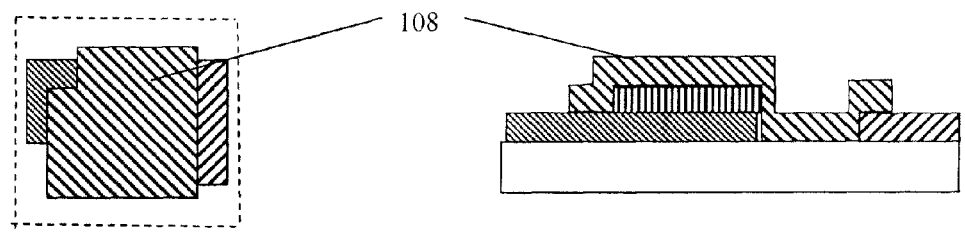
Figure 1E:
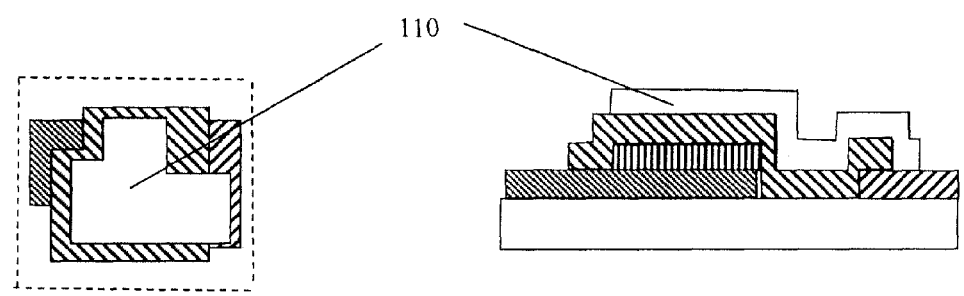
Figure 1F:
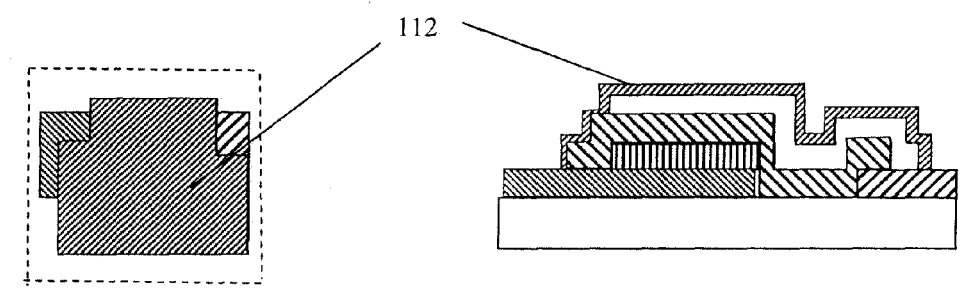

Accordingly, the target material for the cathode layer (e.g. cathode layer 106 in FIG. 1C), according to this embodiment of the invention can be represented by:

$$LiM_aN_bZ_c$$

Where: M is one or more elements chosen from Co, Mn, Al, Ni and V;

N is one or more substitutional elements chosen from the alkaline earth elements (e.g. Mg, Ca, Sr, Ba, and Ra);

Z is one or more elements/molecules chosen from ($PO_4$), O, F, N, etc.; and a, b, c specify the relative atomic fractions of the target material.

Note that the composition of the deposited film may not be identical to that of the target material, but will be very close. The desired stoichiometry of the deposited film will be reflected primarily in the values of a and c. Some examples follow. If the desired cathode layer composition and morphology belongs to the group of $LiCoO_2$ and analogous materials, then the ratio of a to c will be roughly 1 to 2. If the desired cathode layer composition and morphology belongs to the group of spinel materials such as $LiMn_2O_4$, then the ratio of a to c will be roughly 2 to 4. If the desired cathode layer composition and morphology belongs to the group of $LiFePO_4$ and analogous materials, then the ratio of a to c will be roughly 1 to 1. Furthermore, the deposited films are not restricted to stoichiometric materials—substoichiometric/non-stoichiometric compositions may be used. Regarding the relative amount of substitutional element N, the ratio of b to a should be less than 1 to 4, in other words $0.2 > \{b/(a+b)\} > 0$. Although, in preferred embodiments $0.12 > \{b/(a+b)\} > 0.05$.

The substitution elements, N, preferably contribute (electrons) to the conduction bands while increasing the size of the diffusion channels. Whereas Mg and Ni have been used in past studies for bulk materials, the present inventors recognize that analogous (or perhaps better) results can be obtained with other metals of the alkaline earth column and d-orbital rows of the Periodic Table. The ultimate choice will be determined by many factors, including pertinent properties of the resulting TFBs and cost.

There are several potential benefits of using new cathode materials according to the invention. First, the increase in electrical conductivity will allow application of non-RF sputtering techniques that are capable of higher deposition rates, and further allow higher power delivery to the target as compared to undoped targets. As an example, a pulsed DC (pDC) sputtering technique can be used which exhibits higher deposition rates than the rates available with RF techniques. With a new deposition source (explained in more detail below), a significantly higher deposition rate, beyond those available using just pDC, is anticipated. Moreover, the increase in electrical and ionic conductivities of the bulk sputtering target material can lead to higher conductivities in the deposited materials. Such improved properties can allow a thicker cathode layer (versus the non-substituted cathodes) for higher charge, energy and power densities, as the effect from overall impedance increase is minimized (as compared to the non-substituted TFB). The traditional loss of energy/power density due to thickness can be seen from previous studies, wherein the thicker cathode layer leads to lower energy density at higher power application.

In order to take advantage of pDC sputtering the target needs to have a resistivity of less than 1E5 Ohm-centimeters. Utilizing a sputter target such as $LiCo_{1-x}Mg_xO_2$ the deposited cathode layer has a resistivity of less than 1E1 Ohm-centimeters. This now reduces the overall impedance of the TFB, which allows greater current capability or greater cathode thickness with comparable current capability to undoped cathodes. With the anticipated increase in ionic conductivity, the effect will be accentuated further. For example, cathode layers may be at least 3 to 5 microns thick.

Another embodiment of the invention that addresses both the deposition rate and properties of the deposited film will now be described. According to one aspect of this embodiment, higher deposition rates and improved film properties are achieved by using combinatorial plasma sources. According to another aspect, the present inventors apply new deposition methods and sources, as well as methods and sources from existing Si—IC applications (e.g. U.S. Pat. No. 5,886,866 to G. Hausmann).

Figure 2:
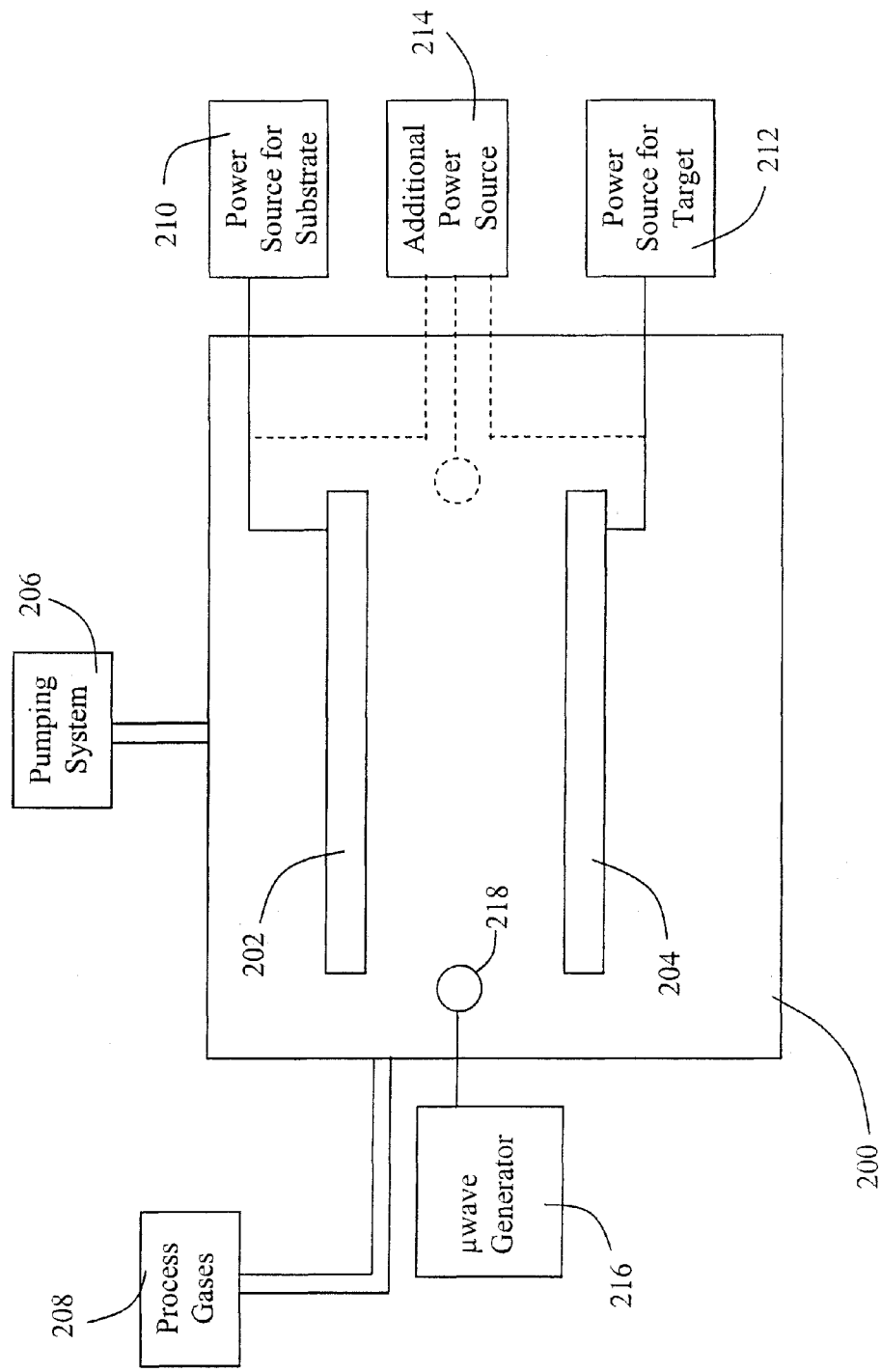
FIG. 2 is a schematic block diagram of an example combinatorial plasma chamber according to aspects of the invention.

An example combinatorial plasma system according to an embodiment of the invention is shown schematically in FIG. 2. The system includes a chamber 200 housing a substrate holder 202 for holding a substrate and a sputter target 204. Pumping system 206 is connected to chamber 200 for controlling a pressure therein, and process gases 208 represents sources of gases supplied to chamber 200 used in the deposition process. According to aspects of the invention, combinatorial plasma is achieved by coupling appropriate plasma power sources 210 and 212 to both the substrate 202 and target 204. An additional power source 214 may also be applied to the target, substrate or for transferring energy directly to the plasma, depending on the type of plasma deposition technique. Furthermore, a microwave generator 216 may provide microwave energy to a plasma within the chamber through the antenna 218. Microwave energy may be provided to the plasma in many other ways, as is known to those skilled in the art.

Depending on the type of plasma deposition technique used, substrate power source 210 can be a DC source, a pulsed DC (pDC) source, a RF source, etc. Target power source 212 can be DC, pDC, RF, etc., and any combination thereof. Additional power source 214 can be pDC, RF, microwave, a remote plasma source, etc.

Although the above provides the range of possible power sources, it is preferred that the plasma sources be provided in the following combinations of power source to target plus power source to substrate. For cathode layer deposition: (1) pDC at the target plus RF substrate bias; (2) pDC at the target plus microwave plasma, without any substrate bias and where the microwave plasma affects both the target and the growing film; (3) pDC at the target plus microwave plasma plus RF substrate bias. Although pDC sputtering of the target is preferred when the target is sufficiently conductive, RF sputtering may also be used. For electrolyte layer deposition: (1) RF at the target plus microwave plasma enhancement; (2) RF at the target plus HF/RF substrate bias; and (3) RF at the target plus microwave plasma plus HF/RF substrate bias. The nomenclature HF is used to indicate the potential need for power sources of two different frequencies, where the frequencies are sufficiently different to avoid any interference. Although, the frequencies of the RF at the target and at the substrate may be the same providing they are locked in phase. Furthermore, the substrate itself can be biased to modulate the plasma-substrate interactions. An RF bias is preferred, although a DC bias or a pDC bias is an option.

Process conditions for deposition of cathode and electrolyte layers of the TFB according to the present invention are provided in Table I below.

TABLE I

Potential ranges of deposition process conditions are provided for both the cathode and electrolyte layers of the TFB, according to the present invention. The power levels for pDC and RF can be based on the target surface area, for microwave the power levels are based on the "antenna area", and for RF/HF bias the power levels are based on substrate surface area.

| Target Materials | Process Gases | Chamber Pressure | Target pDC Power Level | Target RF Power Level | Plasma Microwave Power Level | Substrate RF/HF Bias Power Level |
|---|---|---|---|---|---|---|
| Cathode: $LiCoO_2$ $LiCo_xMg_yO_2$ | $Ar/O_2$ | 1-100 mTorr | Up to 25 W/cm² | N/A | Up to 10 W/cm² | Up to 5 W/cm² RF |
| Electrolyte: $Li_3PO_4$ | $N_2$ | 1-100 mTorr | N/A | Up to 5 W/cm² | Up to 10 W/cm² | Up to 5 W/cm² HF or RF |

According to aspects of the invention, the combined plasma sources are expected to increase the modulation capability of the target bias and plasma density to increase the yield from the target (and thus the deposition rate), and at the same time, allow redirecting of the plasma energy to affect the depositing film. The purpose of redirecting the plasma energy to the growing film is to affect the crystallinity and surface morphology. Additionally, the redirected energy can enhance the internal microstructure and stress to contribute to improved TFB performance and stack stability.

The improved crystallinity in cathode layers deposited using the above-described combinatorial plasma deposition source will allow elimination or reduction of the need to anneal the cathode layer after deposition, which will lead to increased throughput, lower cost, and reduced complexity. If additional excitation is needed, the deposition chambers can be fitted with heating capability, either thermal or electromagnetic (EM) radiation. Additionally or alternatively, post-deposition thermal or EM radiation treatment can be performed, including microwave post and in-situ anneal. For the EM radiation treatment, a specific wavelength would be selected for layer-specific rapid thermal anneal, in situ. The point is to eliminate the time-consuming ex situ "furnace anneal" to minimize the impact on throughput and complexity.

One of the benefits of the deposition methods of the present invention, improved surface morphology, will allow improved conformal and pinhole free coverage during the key subsequent electrolyte deposition step. In fact, the suitability of the resulting surface morphology for electrolyte deposition would be a yield enhancing requirement for all processes, including the high deposition rate processes. In actual tests performed by the present inventors, a 600 nm Al-layer was formed by conventional evaporation processing, and a 600 nm Al-layer was formed by plasma activated evaporation. A microscopic comparison of the layers was performed. The Al-layer formed by conventional processing exhibited a columnar structure and a rough surface. On the other hand, the impact of additional plasma during Al film deposition according to the invention was readily apparent—the Al-layer is a denser, pinhole-free film with smooth surface morphology.

The combinatorial plasma sources, as discussed above, can also be used to enhance the deposition rate, the film density and the surface morphology of the electrolyte layer in a TFB. The higher deposition rate will increase the process throughput, while the enhanced density and surface morphology improve the TFB yield.

Figure 3:
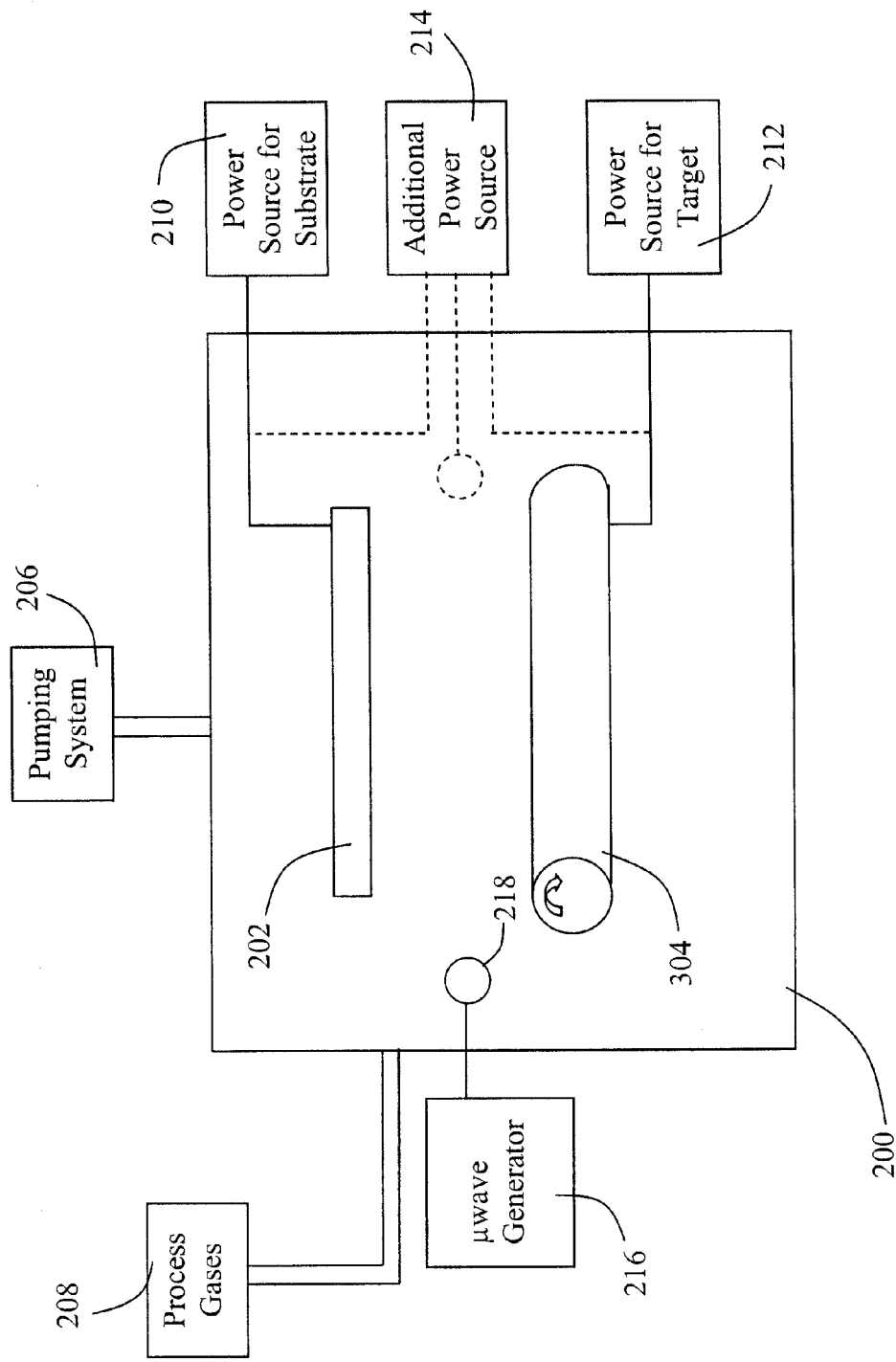
FIG. 3 is a schematic block diagram of an example combinatorial plasma chamber with a rotatable cylindrical target according to aspects of the invention.

Further to the planar sputter target 204 shown in FIG. 2, the sputter deposition may use single rotatable cylindrical targets 304 and dual rotatable cylindrical targets. See FIG. 3. The configuration of rotatable cylindrical targets is well known to those skilled in the art. Supply of microwave energy to the plasma may include ECR. RF power may by supplied in CW or burst mode. Furthermore, HPPM may be utilized as a sputtering power supply.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of fabricating a thin film battery cathode layer, comprising:
   providing a sputtering target with an average composition of $LiM_aN_bZ_c$, wherein $0.20 > \{b/(a+b)\} > 0$, N is an alkaline earth element, M is selected from the group consisting of Co, Mn, Al, Ni and V, and Z is selected from the group consisting of ($PO_4$), O, F and N; and
   depositing said cathode layer on a substrate using a plasma enhanced physical vapor deposition process, said depositing comprising:
      applying power from a target power source to said sputtering target to generate a plasma between said sputtering target and said substrate;
      during applying power from said target power source to said sputtering target, applying power from an additional power source to at least one of said sputtering target, said plasma and said substrate; and
   controlling both said target power source and said additional power source to redirect plasma energy from ions in said plasma between said sputtering target and said substrate to ions travelling to said cathode layer for forming said cathode layer.

2. A method as in claim 1, wherein $0.12 > \{b/(a+b)\} > 0.05$.

3. A method as in claim 1, wherein said cathode layer has a spinel composition and morphology, M is Mn, and Z is O.

4. A method as in claim 1, wherein M is Co, Z is O, and said cathode layer has a composition and morphology of $LiCoO_2$.

5. A method as in claim 1, wherein said sputtering target has an electrical resistivity of less than 1E5 Ohm-centimeters.

6. A method as in claim 1, wherein said cathode layer has an electrical resistivity of less than 1E1 Ohm-centimeters.

7. A method as in claim 1, wherein said cathode layer has a thickness greater than 3 microns.

8. A method as in claim 1, wherein said depositing step includes (1) generation of a plasma between said sputtering target and said substrate and (2) application of pulsed direct current to said sputtering target.

9. A method as in claim 8, wherein said depositing step further includes (3) applying radio frequency power to said substrate, and (4) supplying microwave energy to said plasma.

10. A method as in claim 1, wherein said depositing step includes (1) generation of a plasma between said sputtering target and said substrate and (2) supplying microwave energy to said plasma.

11. A method as in claim 1, wherein said depositing step includes applying radio frequency power to said substrate.

12. A method as in claim 1, wherein said depositing includes:
applying radio frequency power from said target power source to said sputtering target to generate a plasma between said sputtering target and said substrate;
during applying radio frequency power from said target power source, applying radio frequency power from said additional power source to said sputtering target; and
controlling both said target power source and said additional power source to simultaneously increase the sputter rate of said sputtering target and redirect plasma energy from ions in said plasma between said sputtering target and said substrate to ions travelling to said cathode layer.

13. A method as in claim 12, wherein said depositing includes applying direct current power to said sputtering target.

14. A method as in claim 13, wherein said direct current power is pulsed direct current power.

15. A method as in claim 12, wherein said depositing includes applying radio frequency power from a substrate power source to said substrate.

16. A method as in claim 15, wherein the frequencies generated by said target power source and said substrate power source are different.

17. A method as in claim 15, wherein the frequencies generated by said target power source and said substrate power source are the same and are locked in phase.

18. A method as in claim 12, wherein said sputtering target is a rotatable cylindrical target.

19. A method as in claim 12, further comprising supplying microwave energy to said plasma.

* * * * *